United States Patent
Zink

(10) Patent No.: US 10,641,849 B2
(45) Date of Patent: May 5, 2020

(54) SIZE-VARIABLE LOCAL COIL MATRIX WITH VARIABLE DECOUPLING

(71) Applicant: Stephan Zink, Erlangen (DE)

(72) Inventor: Stephan Zink, Erlangen (DE)

(73) Assignee: Siemens Healthcare GmbH, Erlangen (DE)

(*) Notice: Subject to any disclaimer, the term of this patent is extended or adjusted under 35 U.S.C. 154(b) by 377 days.

(21) Appl. No.: 15/643,946

(22) Filed: Jul. 7, 2017

(65) Prior Publication Data

US 2018/0017643 A1    Jan. 18, 2018

(30) Foreign Application Priority Data

Jul. 13, 2016    (DE) ........................ 10 2016 212 724

(51) Int. Cl.
| | |
|---|---|
| *G01R 33/341* | (2006.01) |
| *G01R 33/36* | (2006.01) |
| *H03J 3/24* | (2006.01) |
| *H03J 3/20* | (2006.01) |
| *G01R 33/34* | (2006.01) |
| *H03J 3/12* | (2006.01) |
| *G01R 33/3415* | (2006.01) |

(52) U.S. Cl.
CPC ....... *G01R 33/3628* (2013.01); *G01R 33/341* (2013.01); *G01R 33/34084* (2013.01); *G01R 33/3642* (2013.01); *H03J 3/12* (2013.01); *H03J 3/20* (2013.01); *H03J 3/24* (2013.01); *G01R 33/3415* (2013.01); *G01R 33/34046* (2013.01)

(58) Field of Classification Search
CPC .............. G01R 33/543; G01R 33/5608; G01R 33/4828; G01R 33/3628; G01R 33/34084; G01R 33/341; G01R 33/3642; H03J 3/12

USPC ................ 324/260, 322, 307, 309, 318, 314
See application file for complete search history.

(56) References Cited

U.S. PATENT DOCUMENTS

| | | | | |
|---|---|---|---|---|
| 4,791,372 A | * | 12/1988 | Kirk ..................... | G01R 33/341 324/318 |
| 4,897,604 A | * | 1/1990 | Carlson ............ | G01R 33/34053 324/318 |
| 5,143,068 A | * | 9/1992 | Muennemann ........ | A61B 5/055 324/318 |

(Continued)

FOREIGN PATENT DOCUMENTS

| | | |
|---|---|---|
| DE | 102005039380A1 A1 | 3/2007 |
| DE | 102006027189A1 A1 | 12/2007 |

(Continued)

OTHER PUBLICATIONS

German Office Action for related German Application No. 10 2016 212 7241 dated Feb. 9, 2017, with English Translation.

*Primary Examiner* — Patrick Assouad
*Assistant Examiner* — Taqi R Nasir
(74) *Attorney, Agent, or Firm* — Lempia Summerfield Katz LLC

(57) ABSTRACT

A local coil matrix for a magnetic resonance tomograph and a magnetic resonance tomograph with a local coil matrix are provided. The local coil matrix has a first coil with two detachable coil segments. The two coil segments have electrical connecting elements. The electrical connecting elements are configured to produce an electrical connection between the coil segments in different relative positions of the two coil segments to each other.

19 Claims, 4 Drawing Sheets

(56) References Cited

U.S. PATENT DOCUMENTS

| | | | |
|---|---|---|---|
| 6,184,684 B1* | 2/2001 | Dumoulin | G01R 33/3628 |
| | | | 324/318 |
| 2005/0107686 A1* | 5/2005 | Chan | G01R 33/3415 |
| | | | 600/422 |
| 2007/0040555 A1* | 2/2007 | Wohlfarth | G01R 33/3415 |
| | | | 324/318 |
| 2008/0007259 A1* | 1/2008 | Driemel | G01R 33/3415 |
| | | | 324/260 |
| 2012/0256633 A1 | 10/2012 | Biber et al. | |
| 2012/0293176 A1* | 11/2012 | Zink | G01R 33/34007 |
| | | | 324/322 |
| 2017/0248666 A1* | 8/2017 | Rothgang | G01R 33/3415 |

FOREIGN PATENT DOCUMENTS

| | | |
|---|---|---|
| DE | 102011007065A1 A1 | 10/2012 |
| DE | 102011076119A1 A1 | 11/2012 |

* cited by examiner

SIZE-VARIABLE LOCAL COIL MATRIX WITH VARIABLE DECOUPLING

The application claims the benefit of German Patent Application No. DE 10 2016 212 724.1, filed Jul. 13, 2016, which is hereby incorporated by reference in its entirety.

TECHNICAL FIELD

The disclosure relates to a local coil matrix for a magnetic resonance tomograph and a magnetic resonance tomograph with a local coil matrix. The local coil matrix has a flexible first coil with two detachable coil segments.

BACKGROUND

Magnetic resonance tomographs are imaging devices which, in order to image an examination object, align nuclear spins of the examination object with a strong external magnetic field and excite them to precess around this alignment by an alternating magnetic field. The precession or return of the spins excited therefrom into a state with lower energy in turn generates an alternating magnetic field, (also described as a magnetic resonance signal), as a response, which is received by way of antennae.

With the aid of magnetic gradient fields, the signals are imprinted with spatial encoding, which subsequently enables the assignment of the received signal to a volume element. The received signal is then evaluated and a three-dimensional imaging representation of the examination object provided.

To stimulate the precession of the spin, alternating magnetic fields with a frequency corresponding to the Larmor frequency for the respective static magnetic field strength, and very high field strengths or outputs are necessary. To improve the signal-to-noise ratio of the magnetic resonance signal received by the antennae, (antennae designated as local coils may be used), arranged directly on the patient.

However, individual patients differ considerably in their physiognomy with the result that with a rigid local coil either an optimum signal is only obtained for a few patients or many local coils with different dimensions have to be kept ready.

Local coil matrices are another option, in which individual coils are arranged in a matrix. Such a local coil matrix may be flexibly designed so that it may be configured to the body shape to a certain extent. However, the flexibility is limited, for example, additional openings for limbs cannot be provided flexibly in such a local coil matrix. If, on the contrary, the limbs are wrapped with the flexible local coil matrix, the ends overlap and alter the high frequency properties and impair image acquisition.

SUMMARY AND DESCRIPTION

The scope of the present disclosure is defined solely by the appended claims and is not affected to any degree by the statements within this description. The present embodiments may obviate one or more of the drawbacks or limitations in the related art.

It is an object of the disclosure to provide a local coil that produces better image results for different patients.

The object is achieved by a local coil matrix and a magnetic resonance tomograph.

The local coil matrix for a magnetic resonance tomograph has a first coil with two detachable coil segments. A local coil matrix refers to a two-dimensional arrangement of coils covering a surface. The first coil is flexible in the sense that the shape of a surface in which the coil is located may be deformed with less force, for example, that which may be applied by a Velcro fastener, strap, or an elastic connector or manually. The first coil has two segments that may be detached from each other so that the area in which the first coil is arranged may be separated into two parts. The two parts may be separated by moving on one surface on which the two segments are arranged. Both segments are, for example, two semi-circles, ellipses, ovals, or segments of other closed curves, which are juxtaposed, and not two concentrically arranged flexible sheet materials such as concentric rings or the like.

The two coil segments have electrical connecting elements configured to create an electrical connection between the coil segments in different relative positions of the two coil segments to each other. Depending on the embodiment of the first coil, the electrical connecting elements may connect one or more conductors or conductor tracks side by side. For example, these may be contact grinders on one segment that may be brought into contact with land areas on the other segment. However, juxtaposed pins or push buttons that may be meshed with different counterparts arranged along the other segment in different positions are also conceivable. These may be individual contacts or several juxtaposed contacts so that a first coil with several windings may also be divided into segments and reassembled by way of the electrical connections. The electrical connecting elements may be protected by a protective cover, (e.g., a layer of insulation or an insulating cover), so that the electrical connecting elements do not come into contact with the patient when the coil segments are closed.

The first coil may be a receiver coil and/or transmitter coil. It is also conceivable that both receiver coils and transmitter coils are provided in the local coil matrix and these are first coils. The simultaneous use of a first coil as a receiver and transmitter coil is likewise conceivable. Advantageously, the local coil matrix permits an opening to be provided at the position of the first coil and also closed again electrically conductive with a modifiable geometry so that the local coil matrix may be adjusted to the anatomy of a patient at the position of the first coil.

The magnetic resonance tomograph shares the advantages of the local coil matrix.

In a possible embodiment of the local coil, the first coil is a flexible coil. This is understood to mean that the first coil is flexibly designed at least to a greater extent, in other words 20%, 50%, 80%, or more of the circumference so that the first coil may be deformed without damage. In particular, the first coil may be designed flexibly in the region of the electrical connecting elements.

A flexible first coil advantageously simplifies an adjustment of the local coil matrix in shape and size and also makes handling of the electrical connecting elements easier.

In a possible embodiment, the electrical connecting elements are configured to only produce an electrical connection at discrete predefined and spatially separated relative positions. For example, electrically conductive snap fasteners or plug-in connectors are conceivable.

Advantageously, electrical connecting elements with different discrete closing positions simultaneously permit a connection that is easy to change and manage, which provides a fixed electrical and mechanical connection.

In a possible embodiment of the local coil matrix, this has a tuning device with a tuning element. The tuning element may be a changeable capacity, inductance or also a module with complex resistance. The tuning device is configured to tune a resonance circuit having the first coil in different relative positions of the coil segments of the first coil to a predetermined resonance frequency. The predetermined resonance frequency may be the Larmor frequency of the magnetic resonance tomograph.

By the tuning device, it is possible to keep the electrical properties of the first coil relevant to image acquisition in different relative positions unchanged and in this way to also provide uniform image quality in examination objects with different dimensions.

In a possible embodiment of the local coil matrix, the electrical connection elements are configured in a first relative position of the different relative positions to activate a first tuning device such that the resonance circuit is tuned to the predetermined resonance frequency. For example, it is conceivable that the electrical connection elements may be closed in two different relative positions and in one of these positions a first tuning device, for example, with a first inductance as a tuning element, is connected into the circuit of the coil so that this also has the same total inductance and predetermined resonance frequency with changed geometry.

In a possible embodiment of the local coil matrix, the local coil matrix has a second tuning device, wherein the electrical connection elements in a second relative position of the different relative positions activate the second tuning device such that the resonance circuit is tuned to the predetermined resonance frequency. For example, in the second position a second inductance may be connected so that again with this changed geometry, the coil also has the same total inductance and predetermined resonance frequency.

Advantageously, the second or also further tuning device may enable an adjustment of the geometry in two or more steps without changing the resonance frequency and thus make handling of the local coil matrix easier and more flexible.

In a possible embodiment of the local coil matrix, the tuning device has a position detector to determine the relative position of both coil segments in relation to each other. The relative position may take place, for example, by coding contacts in predetermined relative positions, by distance measurement with electrical variables such as resistance, optical measurement methods such as optical encoding with read-out sensors or with other methods. The tuning device is configured to change a parameter of the tuning elements as a function of the ascertained relative position such that the resonance circuit is tuned to the predetermined resonance frequency. Conceivable here, for example, are voltage-controlled PIN diodes as variable capacities controlled by the tuning device. Fixed inductances or capacities that are flexibly interconnected with the coil by switch elements of the tuning device, for example, are also possible.

The tuning device itself may have a control or regulation system that compensates for a change in the properties of the first coil in different relative positions. However, it is also conceivable that the control or regulation system is part of the magnetic resonance tomograph and alters the electrical properties of the tuning element by way of a signal connection.

By the tuning device, it is advantageously possible to keep the properties of the first coil unchanged in different relative positions and in this way, to also provide uniform image quality for examination objects with different dimensions.

In a possible embodiment of the local coil matrix, the electrical connecting elements of the first coil are distanced from a second coil such that a coupling of the first coil with an adjacent second coil remains largely unchanged when there is a change in the relative position of the two coil segments of the first coil to each other. Thus, for example, adjacent second coils may overlap with the first coil in areas for compensation, which are at a great distance or at the greatest possible distance from the electrical connecting elements, resulting in a change in the geometry of the first coil, where the coil segments have a different relative position, having little or no impact on the coupling as the geometry of the first coil only changes slightly or not at all in the vicinity of the second coils. For example, the coupling of the coils only changes by 5, 10, or 20 percent (e.g., the coupling of the coils remains "largely" unchanged).

The arrangement of the electrical connecting elements in relation to the adjacent second coils is an option for advantageously uncoupling the first coil from the second coils regardless of the relative position of the coil segments of the first coil.

In a possible embodiment of the local coil matrix, a substantial part of the local coil matrix assumes a predetermined rigid shape. A substantial part may refer to more than 20, 50, or 80 percent of a total surface of the local coil matrix configured as a rigid surface. For example, the local coil matrix may include two half-shells connected by two flexible sections. The first coil may be arranged in a flexible section. However, it is just as conceivable that the local coil matrix only has one rigid part and one flexible part respectively or a majority of flexible and rigid parts.

In another possible embodiment of the local coil matrix, a substantial part of the local coil matrix is flexible in design. A substantial part may refer to more than 20, 50, or 80 percent of a total surface of the local coil matrix being flexible in design.

Advantageously, rigid parts of the local coil matrix, for example, enable a half-shell for a knee, better positioning of an examination object, including in relation to the field magnets of the magnetic resonance tomograph, while the flexible part enables better adjustment to the dimensions of the examination object, for example, to the size of the knee. A majority of rigid and flexible sections may make three-dimensional adjustment easier.

In a possible embodiment of the local coil matrix, the local coil matrix has a majority of first coils. The first coils may be arranged adjacently.

By arranging the first coil or a majority of first coils in a flexible area, the local coil matrix may be better adjusted to the desired dimensions. If the first coils are adjacent, an opening exceeding the dimensions of an individual first coil may be advantageously provided in the local coil matrix.

BRIEF DESCRIPTION OF THE DRAWINGS

Further advantages and details are provided in the following description of exemplary embodiments in conjunction with the diagrams. In the schematic diagrams.

DETAILED DESCRIPTION

Figure 1:
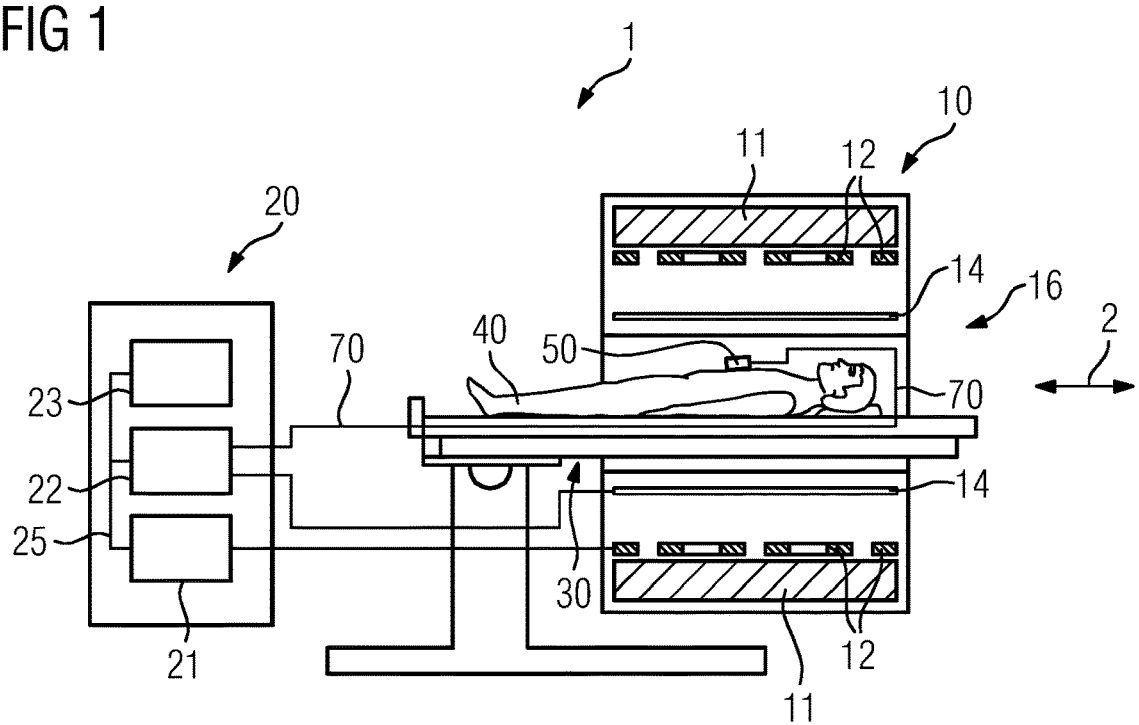
FIG. 1 depicts an embodiment of a magnetic resonance tomograph.

FIG. 1 depicts a schematic representation of an embodiment of a magnetic resonance tomograph 1 with a local coil matrix 50.

The magnet unit 10 has a field magnet 11 that generates a static magnetic field B0 to align nuclear spin of samples or in a body of a patient 40 in a recording area. The recording area is arranged in a patient tunnel 16 extending in a longitudinal direction 2 through the magnet unit 10. The field magnet 11 may be a superconducting magnet providing magnetic fields with a magnetic flux density of up to 3 T, in the latest devices even more than that. For lower field strengths, however, permanent magnets or electromagnets with normally conducting coils may be used.

Moreover, the magnet unit 10 has gradient coils 12 configured to superimpose the variable magnetic fields on the magnetic field B0 in three spatial directions to spatially differentiate the recorded image areas in the examination volume. The gradient coils 12 may be coils including normally conducting wires, which may generate mutually orthogonal fields in the examination volume.

The magnet unit 10 also has a body coil 14 configured to emit a high frequency signal supplied by way of a signal line into the examination volume and to receive resonance signals emitted by the patient 40 and emit them by way of a signal line. Moreover, the magnetic resonance tomograph has one or more local coils 50 arranged close to the patient 40 in the patient tunnel 16.

A control unit 20 supplies the magnet unit 10 with the different signals for the gradient coils 12 and the body coil 14 and evaluates the received signals.

The control unit 20 thus has a gradient control 21 configured to supply the gradient coils 12 with variable currents by way of supply lines which provide the desired gradient fields in the examination volume in a coordinated manner.

Moreover, the control unit 20 has a high frequency unit 22 configured to generate a high frequency pulse with a predetermined chronological order, amplitude and spectral power distribution to excite magnetic resonance of the nuclear spin in the patient 40. Pulse power in the range of kilowatts may be obtained in the process. The individual units are interconnected by way of a signal bus 25.

The high frequency signal generated by the high frequency unit 22 is supplied to the patient table 30 by way of a signal connection 31 and distributed to one or more local coils 50 and emitted into the body of the patient 40 to excite the nuclear spin there.

The local coil 50 may receive a magnetic resonance signal from the body of the patient 40 because due to the short distance, the signal-to-noise ratio (SNR) of the local coil 50 is better than when received by the body coil 14. The MR signal received by the local coil 50 is processed in the local coil 50 and forwarded to the high frequency unit 22 of the magnetic resonance tomograph 1 for evaluation and image acquisition. The signal connection 31 may be used for this purpose, but separate signal connections or wireless transmission are also possible. It is likewise possible for local coils or other antennae to be provided for reception.

Figure 2:
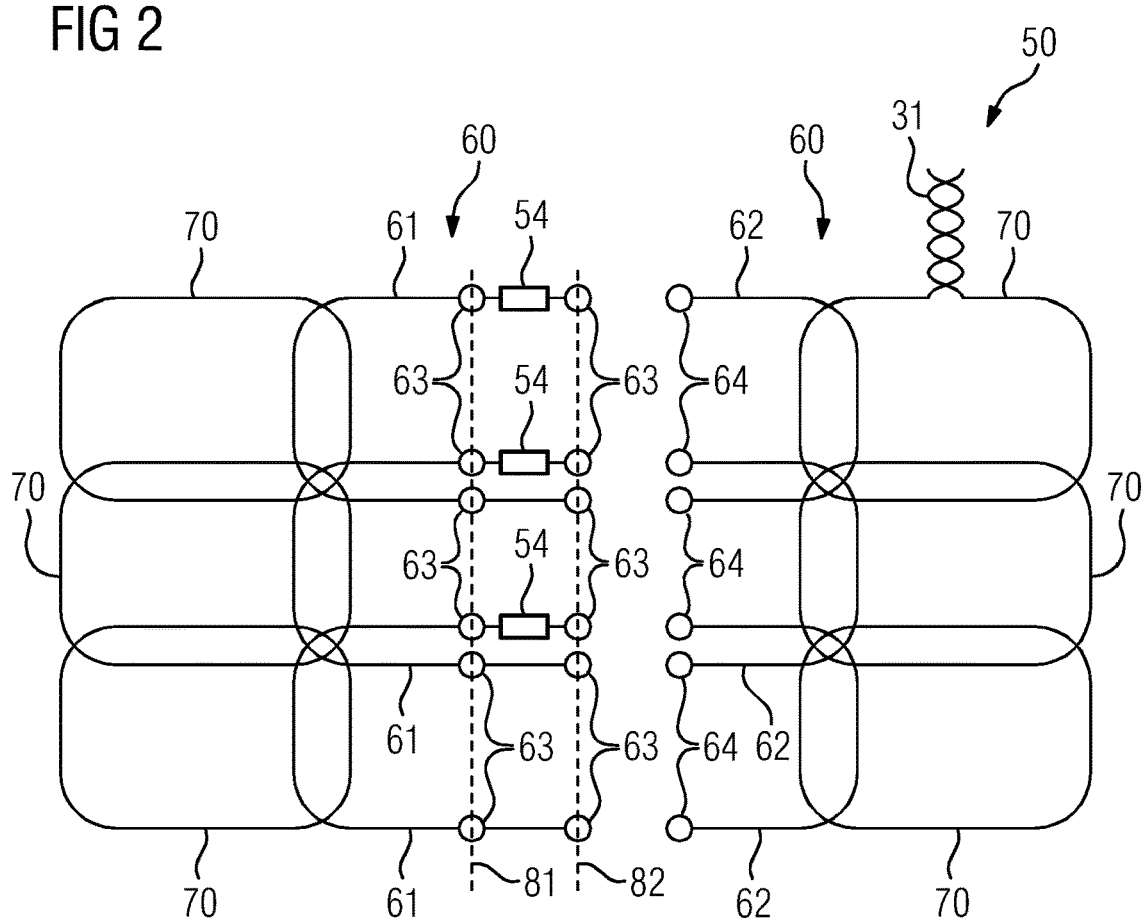
FIG. 2 depicts an embodiment of a local coil matrix or a section thereof.

FIG. 2 is a diagrammatic view of an embodiment of a local coil matrix 50 or a section of such a local coil matrix 50. For reasons of clarity, the representation of FIG. 2 only shows one of the supply lines or signal connections 31 connecting the individual signal coils 60, 70 to the control unit 20 for the transmission of receive signals and/or transmitter signals. Each signal coil 60, 70 may have a separate signal connection 31 to the control unit 20, or the signals of several signal coils 60, 70 are multiplexed by passive or active circuits to one or more signal lines 31.

In the local coil matrix 50, several first coils 60 are arranged next to each other and surrounded by adjoining second coils 70. The peripheral areas of the coils 60, 70 overlap to compensate for crosstalk of the electromagnetic alternating fields. However, other options for compensation are also conceivable, for example, by coupling elements such as inductances or capacities. The number and arrangement of the first coils 60 in a row here is only by way of example and may vary depending on the use of the local coil matrix 50.

The first coils 60 are shown in an open state here, in which the coil segments 61, 62 are electrically separated from each other. On a coil segment 61, electrical connecting elements 63 are each arranged in different positions, which are intended to be meshed and brought into electrical contact with the electrical connecting elements 64 on the other segment 62 of the respective first coil 60. The electrical connecting elements 63, 64 may be configured as a snap fastener and corresponding counterpart (e.g., press studs) or as a socket and plug, so that besides the electrical contact, a mechanical fastening is also provided at the same time. However, it is also conceivable that the electrical connecting elements are configured as land areas and corresponding contacts, so that the predetermined relative position for an electrical contact offers a certain amount of scope for adjustment, wherein the mechanical fixation is provided by a separate fastening element (not shown). Velcro fasteners or other variable fastening elements are conceivable here.

In one embodiment of the local coil matrix 50, the electrical connecting elements 63, 64 are protected from coming into contact with the patient. For example, the connecting elements 63, 64 on exposed surfaces may be provided with an insulation layer. However, it is also conceivable that the local coil matrix 50 has an insulating covering which, after closing the electrical connection of the coil segments 61, 62, protects this from coming into contact with the patient 40. A flexible flap or a slide are conceivable, for example.

The electrical connecting elements 64 of the coil segment 62 shown in FIG. 2 may optionally be connected to two different electrical connecting elements 63 of the coil segment 61. Depending on which of the two electrical connecting elements 63 is selected, the two coil segments 61, 62 of a first coil assume different relative positions 81, 82 to each other. In this way, for example, it is conceivable that the local coil matrix 50 is part of a cuff around a limb and may be adjusted in size through the choice of connecting elements 63.

With the different relative position 81, 82, however, the geometry of the first coil 60 also changes. If an electrical connection of the electrical connecting elements 63, 64 is produced at the predetermined relative position 82, the surface of the first coil 60 is thus enlarged and consequently its inductance. By its self-capacitance or other components not shown such as a capacitor, the first coil 60 forms a resonance circuit 55 with a resonance frequency that decreases because of the increased inductance of the first coil 60 in the predetermined relative position 82 compared with the predetermined relative position 81. This effect may be offset by a capacitor being connected in the resonance circuit as a tuning element 54, which is only effective if the coil segments 61, 62 in the second relative position are electrically connected to each other. By the series connection of the tuning element 54 to a resonance capacitor or the self-capacitance of the first coil 60, the resonance frequency of the resonance circuit is increased again and the effect of the changed geometry compensated. A simple tuning device 53 is produced as a result of the interaction of the tuning element 54 and the electrical connecting elements 63, 64 in the different predetermined relative positions. An electric value of the tuning element 54 is selected such that the resonance frequency in both relative positions 81, 82 assumes the predetermined value, e.g., that of the Larmor frequency of the magnetic resonance tomograph.

However, it is also conceivable, for example, that an inductance is connected in series as a tuning element 54 in the first coil 60, if the electrical contact of the electrical connecting elements 63, 64 is produced at the first position and no additional tuning element 54 is connected in the first coil 60, if the electrical contact is produced in the predetermined position 82. An inductance in series in the first coil 60 compensates for its inductance loss as a result of the smaller surface. Just as conceivable, however, are other embodiments which obtain the same effect by combining different switching components as a tuning element 54.

The second coils 70 are distanced from the electrical connecting elements 63, 64 of the first coils 60. An overlap area of the first coils 60 with the second coils 70 may not change as a result of closing the first coil in the different positions, the coupling of the first coils 60 and the second coils 70 thus remaining largely unchanged.

In the case of the local coil matrix of FIG. 2, it is also conceivable that individual first coils 60 are closed in the first predetermined relative position 81, while other first coils 60 are closed in the second predetermined relative position 82. Thus, for example, is possible to form a curvature in the local coil matrix 50 to tailor it to a shoulder or a knee. It is also conceivable that individual or a few first coils 60 are arranged in an area of second coils 70.

In FIG. 2 and in the following FIG. 3, a distinction is not drawn as to whether the first coils 60 and the second coils 70 shown are receiver coils or transmitter coils. The principle is applicable to both transmitter and receiver coils. Furthermore, it is also conceivable that at least one or more of the first coils 60 and the second coils 70 shown may be employed with a dual function as receiver and transmitter coils or that a local coil matrix 50 has a second structure of first coils 60 and second coils 70 not shown so that the local coil matrix 50 has both a matrix of transmitter coils and a matrix of receiver coils.

Figure 3:
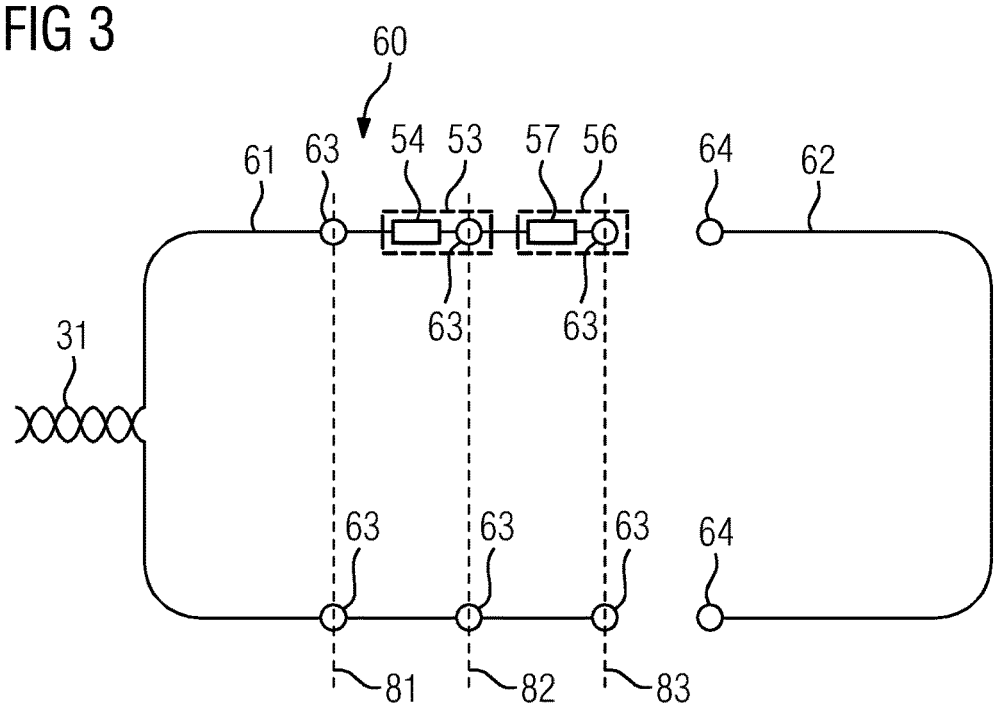
FIG. 3 depicts an embodiment of a first coil of a local coil matrix.

FIG. 3 depicts a diagrammatic view of a first coil 60 of a possible embodiment of a local coil matrix 50. The same reference characters denote the same objects.

The coil 60 has further electrical connection elements 63 arranged such that the first coil 60 may also be electrically closed in a third predetermined relative position 56. To also to provide the same resonance frequency under this geometry changed once again, the coil 60 has a second tuning element 57 that provides a second tuning device 56 in connection with the additional electrical connection elements 63. For example, as aforementioned in FIG. 2, the tuning element 57 may be a further capacitor. However, other tuning elements and circuits are also conceivable that keep the resonance frequency of the first coil largely unchanged from the relative position 81, 82, 56 of the coil segments 61, 62.

Figure 4:
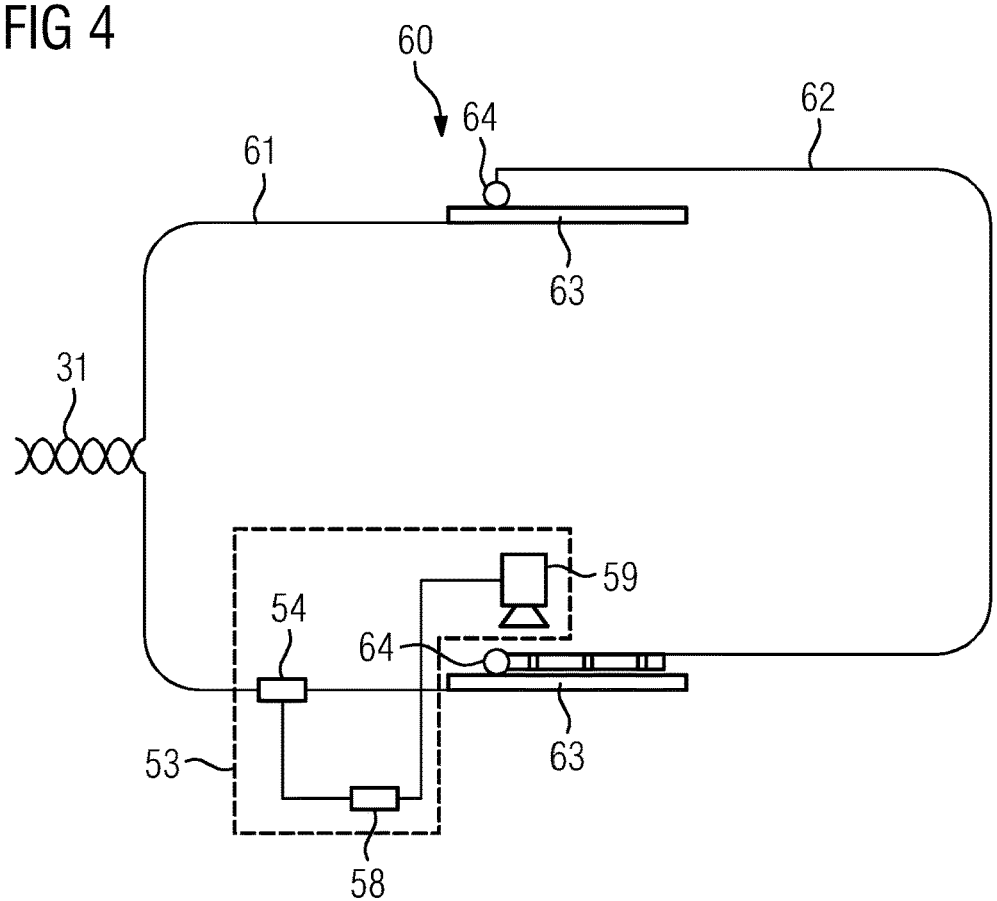
FIG. 4 depicts an embodiment of a first coil of a local coil matrix.

FIG. 4 depicts a first coil 60 of another possible embodiment of a local coil matrix. The same reference characters denote the same objects again.

The first coil 60 shown in FIG. 4 has a tuning element 54, a tuning control 58 and a position detector 59. Unlike the preceding embodiments, the tuning of the resonance frequency of the first coil to the predetermined resonance frequency (e.g., Larmor frequency) does not take place directly as a result of closing the electrical connecting elements 63, 64. The connecting elements 63, 64 may therefore be configured as a contact path and contact wire, enabling the relative position of the two coil segments 61 and 62 of the first coil 60 to also be infinitely variable. By the position detector 58, the tuning control 59 records the relative position of the two coil segments 61, 62 to each other. The position detector may be a camera or optical scanner that reads out an optical marking on the coil segment 62 and thus records the relative position. Also conceivable, for example, is a linear potentiometer as a position detector, which is mechanically connected to the two coil segments 61, 62 so that when the two coil segments are moved towards each other, their resistance value is altered.

Depending on the relative position recorded, the tuning control tunes the tuning element 54 such that the resonance frequency of the resonance circuit 55 with the first coil 60 remains largely unchanged, (e.g., only changes by 2, 5, 10, or 20 percent or less). For example, the tuning control 59 may be a processor that records the relative position by the camera and as a function thereof, outputs a voltage to a PIN diode as a tuning element 54. However, the tuning control may also be an analog circuit that derives the voltage for the PIN diode from the resistance of the linear potentiometer. It would also be conceivable for the tuning control not to be provided in the local coil matrix 50 but in the magnetic resonance tomograph 1.

Figure 5:
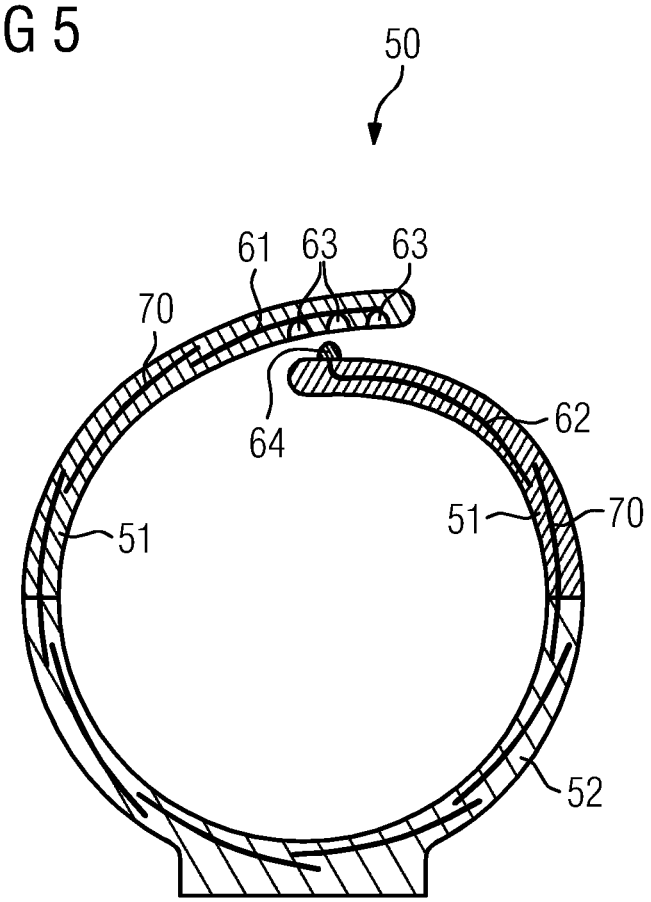
FIG. 5 depicts a cross-section through a local coil matrix.

FIG. 5 depicts a diagrammatic cross section through a possible embodiment of a local coil matrix 50.

The local coil in FIG. 5 has a rigid section 52, which, for example, for a knee coil, may be configured as a stand providing a knee with a support. Two flexible sections 51 connect to this, which may adjust to the knee. As aforementioned, the electrical connecting elements 63, 64 permit two coil segments 61, 62 of a first coil 60 to close in different relative positions to each other and the local coil matrix 50 to thus configured to different knee diameters. In FIG. 5, push buttons are indicated as electrical connecting elements 63, 64. However, it would also be conceivable for the two flexible sections 70 to also be fastened with a mechanical closing element like a strap or Velcro fastener and the electrical connecting elements to only provide an electrical contact by contact tips and land areas.

Figure 6:
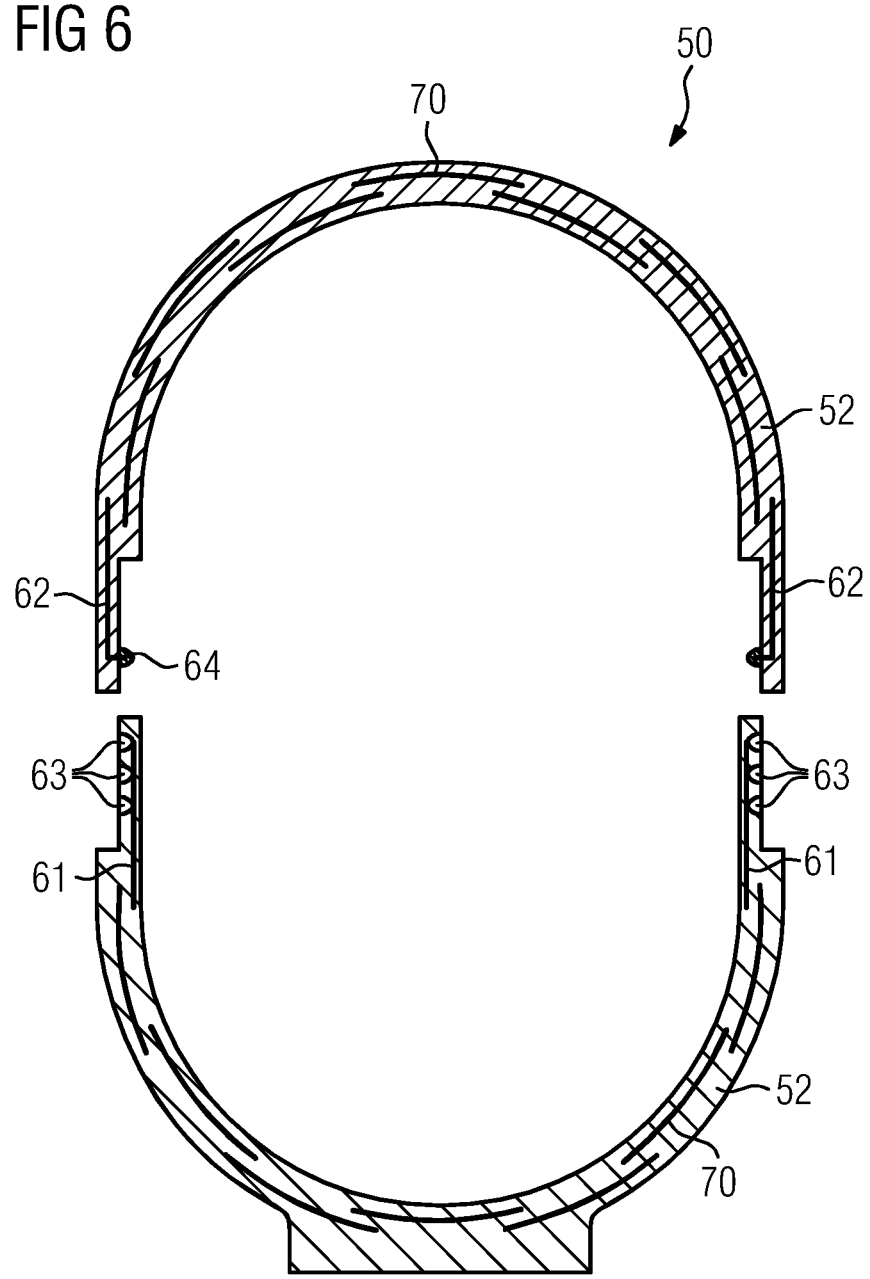
FIG. 6 depicts a cross-section through a local coil matrix.

FIG. 6 depicts a diagrammatic cross section through another possible embodiment of a local coil matrix 50.

The local coil in FIG. 6 has two rigid sections 52. To enable ease of access for the patient 40, the upper rigid section 52 has a first coil 60 at each end. One coil segment 61 is in the lower rigid section 52 and one coil segment 62 in the upper rigid section 52 respectively. The coil segments 61, 62 are each connected by the aforementioned electrical connection elements 63, 64.

It is also conceivable that the local coil matrix 50 only has flexible sections 51.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A local coil matrix for a magnetic resonance tomograph, the local coil matrix comprising:
a first coil having two detachable coil segments; and
a tuning device having a tuning element and a position detector,
wherein the two detachable coil segments have electrical connecting elements configured to produce an electrical connection between the two detachable coil segments in different relative positions of the two detachable coil segments to each other,
wherein the tuning device is configured to tune a resonance circuit, which the first coil has in different relative positions of the two detachable coil segments of the first coil, to a predetermined resonance frequency,
wherein the position detector of the tuning device is configured to determine a relative position of the two detachable coil segments to each other, and
wherein the tuning device is configured to alter a parameter of the tuning element as a function of the relative position such that the resonance circuit is tuned to the predetermined resonance frequency.

2. The local coil matrix of claim 1, wherein the first coil is a flexible coil.

3. The local coil matrix of claim 2, wherein the electrical connecting elements are configured to produce an electrical connection only at discrete, predetermined relative positions, spatially separated from each other.

4. The local coil matrix of claim 1, wherein the electrical connecting elements are configured to produce an electrical connection only at discrete, predetermined relative positions, spatially separated from each other.

5. A local coil matrix for a magnetic resonance tomograph, the local coil matrix comprising:
a first coil having two detachable coil segments; and
a first tuning device having a tuning element,
wherein the two detachable coil segments have electrical connecting elements configured to produce an electrical connection between the two detachable coil segments in different relative positions of the two detachable coil segments to each other,
wherein the first tuning device is configured to tune a resonance circuit, which the first coil has in different relative positions of the two detachable coil segments of the first coil, to a predetermined resonance frequency, and
wherein the tuning element of the first tuning device has a changeable inductance or a module with complex resistance.

6. The local coil matrix of claim 5, wherein the electrical connection elements are configured in a first relative position of the different relative positions to activate the first tuning device such that the resonance circuit is tuned to the predetermined resonance frequency.

7. The local coil matrix of claim 6, further comprising:
a second tuning device,
wherein the electrical connection elements are configured, in a second relative position of the different relative positions, to activate the second tuning device such that the resonance circuit is tuned to the predetermined resonance frequency.

8. The local coil matrix of claim 7, further comprising:
a second coil,
wherein the electrical connecting elements of the first coil are distanced from the second coil such that a coupling of the first coil with the second coil remains largely unchanged when the relative position of the two detachable coil segments of the first coil to each other is changed.

9. The local coil matrix of claim 5, wherein the first tuning device has a position detector configured to determine the relative position of the two detachable coil segments to each other, and
wherein the first tuning device is configured to alter a parameter of the tuning element as a function of the relative position such that the resonance circuit is tuned to the predetermined resonance frequency.

10. The local coil matrix of claim 5, further comprising:
a second coil,
wherein the electrical connecting elements of the first coil are distanced from the second coil such that a coupling of the first coil with the second coil remains largely unchanged when the relative position of the two detachable coil segments of the first coil to each other is changed.

11. The local coil matrix of claim 1, further comprising:
a second coil,
wherein the electrical connecting elements of the first coil are distanced from the second coil such that a coupling of the first coil with the second coil remains largely unchanged when the relative position of the two detachable coil segments of the first coil to each other is changed.

12. The local coil matrix of claim 1, wherein at least 20 percent of a total surface of the local coil matrix assumes a predetermined rigid shape.

13. The local coil matrix of claim 1, wherein at least 50 percent of a total surface of the local coil matrix assumes a predetermined rigid shape.

14. The local coil matrix of claim 1, wherein at least 80 percent of a total surface of the local coil matrix assumes a predetermined rigid shape.

15. The local coil matrix of claim 1, wherein at least 20 percent of the local coil matrix is flexible in design.

16. The local coil matrix of claim 1, wherein at least 50 percent of the local coil matrix is flexible in design.

17. The local coil matrix of claim 1, wherein at least 80 percent of the local coil matrix is flexible in design.

18. The local coil matrix of claim 1, wherein the local coil matrix has a majority of first coils.

19. A magnetic resonance tomograph comprising:
a local coil matrix having:
a coil with two detachable coil segments, the two detachable coil segments comprising electrical connecting elements configured to produce an electrical connection between the two detachable coil segments in different relative positions of the two detachable coil segments to each other; and
a tuning device having a tuning element and a position detector,
wherein the tuning device is configured to tune a resonance circuit, which the coil has in different relative positions of the two detachable coil segments of the coil, to a predetermined resonance frequency,
wherein the position detector of the tuning device is configured to determine a relative position of the two detachable coil segments to each other, and
wherein the tuning device is configured to alter a parameter of the tuning element as a function of the relative position such that the resonance circuit is tuned to the predetermined resonance frequency; and
a control having a signal connection to the local coil matrix, wherein the control is configured to adjust the tuning element as a function of the relative position of the two detachable coil segments of the coil to each other such that the resonance circuit has the predetermined resonance frequency with the coil.

* * * * *